(12) United States Patent
Vashchenko et al.

(10) Patent No.: US 7,375,579 B1
(45) Date of Patent: May 20, 2008

(54) PROGRAMMING OF FUSE-BASED MEMORIES USING SNAPBACK DEVICES

(75) Inventors: Vladislav Vashchenko, Palo Alto, CA (US); Peter J. Hopper, San Jose, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 75 days.

(21) Appl. No.: 11/198,796

(22) Filed: Aug. 4, 2005

(51) Int. Cl.
*H01H 37/76* (2006.01)

(52) U.S. Cl. .................................................. 327/525

(58) Field of Classification Search ................. 327/525
See application file for complete search history.

(56) References Cited

U.S. PATENT DOCUMENTS

| | | | | |
|---|---|---|---|---|
| 5,767,732 A * | 6/1998 | Lee et al. | .................... | 327/525 |
| 6,268,760 B1 * | 7/2001 | Marshall et al. | ............ | 327/525 |
| 6,462,609 B2 * | 10/2002 | Hashimoto et al. | ......... | 327/525 |
| 6,879,206 B2 * | 4/2005 | Mayer et al. | ............... | 327/525 |

* cited by examiner

*Primary Examiner*—Jeffrey Zweizig
(74) *Attorney, Agent, or Firm*—Jurgen Vollrath

(57) ABSTRACT

In a fuse-based programmable circuit block, the poly-fuse is burned out by making use of a snapback device connected in series with the poly-fuse.

19 Claims, 1 Drawing Sheet

PROGRAMMING OF FUSE-BASED MEMORIES USING SNAPBACK DEVICES

FIELD OF THE INVENTION

The invention relates to fuse-based memories and a method of programming the memory cells.

BACKGROUND OF THE INVENTION

For a number of analog applications a programmable block is required, e.g., in the case of a programmable I/O.

One approach that has been adopted in the past is the use of EEPROM cells. The disadvantage of EEPROMs, however, is that they require additional complex programming circuitry and also consume a substantial amount of space.

An alternative that has been used in the past in cases where the block needs to be programmed only once, is to make use of fuses. These fuse cells, in contrast to EEPROM cells provide a close to minimum dimension poly resistor. However, they are programmed by burning the fuse cell out using a CMOS switch circuit. In the case of on-chip programming, this requires a rather complex pulsed switch circuit and a sophisticated process to ensure reliable burn out of the fuse cell.

The present application provides a new solution to programming the fuse cells.

SUMMARY OF THE INVENTION

According to the invention there is provided a method of programming a fuse of a fuse-based programmable circuit block, comprising coupling a snapback device to the fuse so as to pass double injection current through the fuse. The fuse will typically be a poly-fuse. The snapback device may, for example, be an LVTSCR or NMOS device. The method may further include controlling the snapback voltage of the device by biasing the blocking junction control electrode, such as the gate electrode. Preferably the snapback device must be such that its trigger voltage is greater than VDD (the power supply voltage) when the gate-source bias voltage is 0V, and the trigger voltage is less than VDD when the gate is biased to a predefined high voltage such as VDD. The method may include connecting a resistor in series with the poly-fuse to define a resistor divider. The resistor may be chosen to define the initial unprogrammed state of the programmable circuit block as high or low. Once the fuse is blown, the node between fuse and resistor will go either high or low depending on whether the resistor is tied to the power rail or the ground rail.

In another embodiment, two serially connected snapback devices may be connected between the power rail and the ground rail, in parallel with two serially connected fuses. The method may then include biasing the gate of one of the two snapback devices so as to force it into snapback mode, and biasing the gate of the other snapback device to avoid snapback mode.

Further, according to the invention, there is provided a fuse-based programmable circuit block, comprising a resistor divider defined by a resistor and a poly-fuse, and a snapback device connected in series with the poly-fuse, wherein the bias voltage of the control electrode of the snapback device is controllable. The snapback device may be an LVTSCR or NMOS device. The resistor may have a larger or smaller value than the resistance of the poly-fuse. The circuit block may further include an inverter connected to the node between the resistor and the poly-fuse.

Still further, according to the invention there is provided a fuse-based programmable circuit block, comprising a first and a second serially connected poly-fuse, a first and a second serially connected snapback device connected in parallel with the first and second poly-fuses, the node between the poly-fuses being connected to the node between the snapback devices. The node between the poly-fuses may be connected to an inverter.

DETAILED DESCRIPTION OF THE INVENTION

Figure 1:
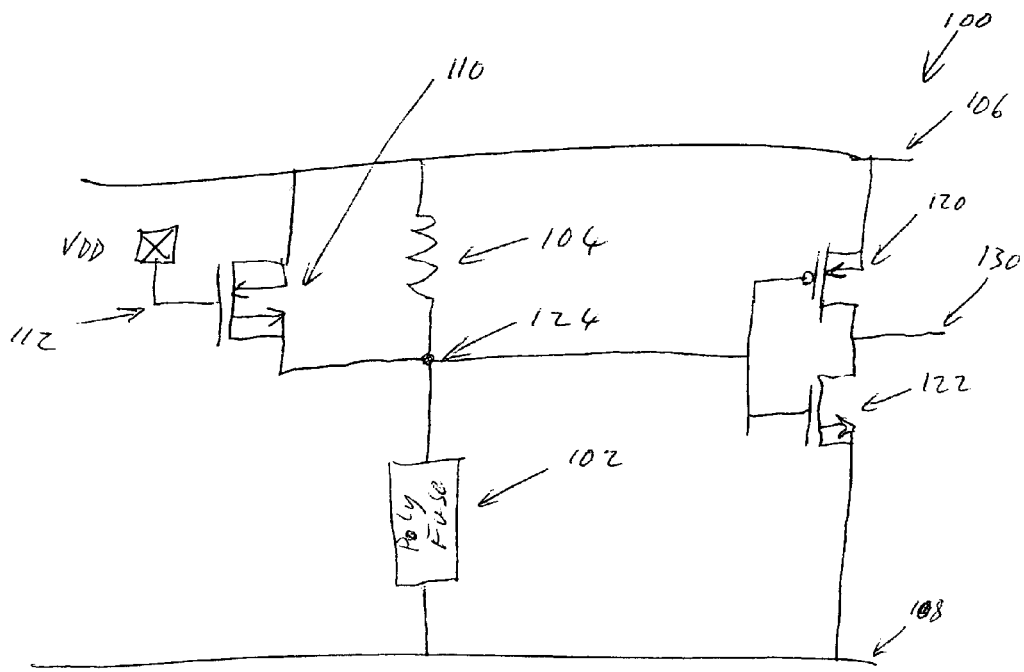
FIG. 1 is a circuit diagram of one embodiment of a fuse-based programmable circuit block of the invention.

One embodiment of a fuse-based programmable circuit block of the invention is shown in FIG. 1. The circuit block 100 includes a poly-fuse 102 connected in series with a resistor 104 between a power rail (VDD) 106 and a ground rail 108 to define a resistor divider. The poly-fuse 102 is also connected in series with a snapback device 110, which in this case is an LVTSCR, but which could be any snapback device with the appropriate characteristics as discussed further below. The LVTSCR 110 has a gate electrode 112, also referred to herein generically as a control electrode. The gate electrode is connectable to VDD and the characteristics of the LVTSCR are chose such that its trigger voltage is greater than VDD (the power supply voltage) when the gate-source bias voltage is 0V, and the trigger voltage is less than VDD when the gate is biased to VDD.

The circuit block further includes an inverter comprising a PMOS transistor 120 and an NMOS transistor 122 connected with their gates to the node 124 between the resistor 104 and poly-fuse 102.

The trigger voltage for an LVTSCR is a function of the gate bias. While the gate is low the LVTSCR remains off even with a high voltage applied to the anode of the device. Since an LVTSCR can deliver 100X the saturation current Idsat of an NMOS, current supplied by an LVTSCR connected in series with a fuse will quickly blow the fuse. Also, once the fuse has burned out the LVTSCR will automatically turn off. The turn-on time of a typical LVTSCR is 1ns. Even if the fuse is not blown in that period of time, the LVTSCR will simply stay on until the fuse burns out.

Thus, in the embodiment of FIG. 1, when the gate 112 is connected to VDD the LVTSCR 110 turns on, pushing large current through the poly-fuse 102 and causing it to burn out. When this happens, the resultant high resistance between node 124 and ground causes the node 124 to go high and the output 130 to go low. By ensuring that the holding voltage of the LVTSCR 110 is higher than the voltage across the resistor 104 once the fuse 102 is blown, the LVTSCR 110 will automatically turn off after the fuse 102 is blown. This eliminates the need for a complex pulse circuit to program the fuse.

Figure 2:
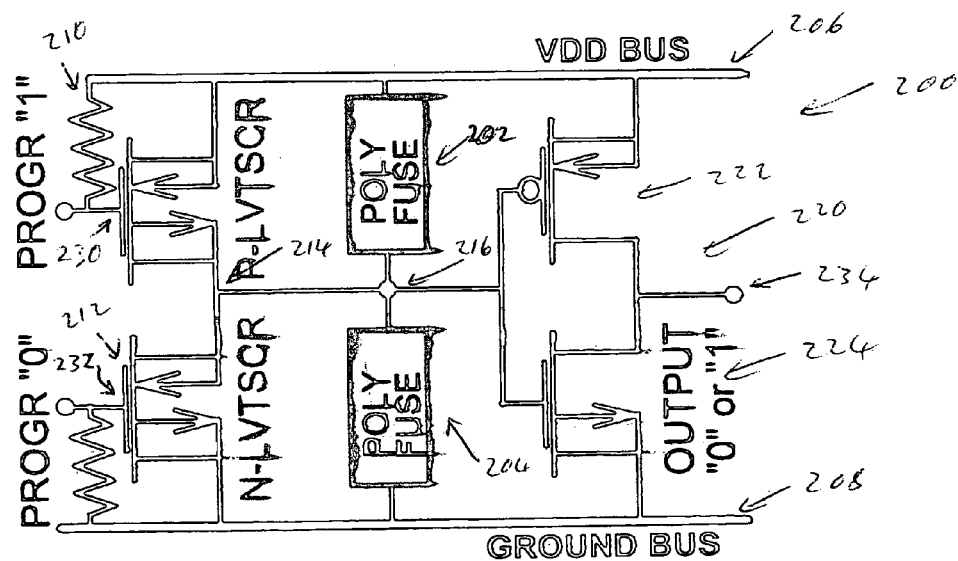
FIG. 2 is a circuit diagram of one embodiment of a fuse-based programmable circuit block of the invention.

Another embodiment of the invention is shown in FIG. 2. In this embodiment of the programmable circuit block 200, two poly-fuses 202, 204 form a resistor divider between VDD rail 206 and ground rail 208, instead of making use of a single poly-fuse and a resistor. The poly-fuses 202, 204 are connected in parallel with the serially connected snapback devices. The first snapback device is a p-LVTSCR 210, and the second snapback device is an n-LVTSCR 212. The node 214 between the two LVTSCRs is connected to the node 216 between the two poly-fuses, which, is in turn connected to an inverter 220 comprising a PMOS transistor 222 and an NMOS transistor 224.

When a high voltage, e.g. VDD is applied to the gate 230 of LVTSCR 210, and a low voltage, e.g. 0V is applied to the gate 232 of the LVTSCR 212, as shown in FIG. 2, LVTSCR 210 will trigger and LVTSCR 212 will not trigger. In the This causes high current to flow through poly-fuse 204 but not poly-fuse 202, causing poly-fuse 204 to blow and establishing a high resistance between node 216 and ground. Thus node 216 will go high and output 234 to go low. It will be appreciated that if the LVTSCRs are oppositely biased to the example above, the output 234 will go high. It will be appreciated that for the LVTSCR to operate properly the trigger voltage VT must be greater than VDD when the gate-source bias voltage VGS is 0V, and VT must be smaller than VDD when VGS is at VDD. In order to ensure automatic turn off of the LVTSCR once the one fuse is blown, the voltage across the other fuse after burn out must be such that it is less than the holding voltage of the LVTSCR that was triggered, i.e., the LVTSCR that is in parallel with the fuse that is not blown.

While two specific embodiments of the invention were discussed above, it will be appreciated that the invention could be implemented in different ways making use of a bistable device to program the poly-fuse.

What is claimed is:

1. A method of programming a fuse of a fuse-based programmable circuit block, comprising
    coupling a snapback device to the fuse so as to pass double injection current through the fuse.
2. A method of claim 1, wherein the fuse is a poly-fuse.
3. A method of claim 2, wherein the snapback is an LVTSCR or NMOS device.
4. A method of claim 1, further comprising controlling the snapback voltage of the device by biasing the gate electrode of the device.
5. A method of claim 4, wherein the snapback device is chosen such that device trigger voltage is greater than the power supply voltage (VDD) when the gate-source bias voltage is 0V, and the trigger voltage is less than VDD when the gate is biased to a predefined high voltage.
6. A method of claim 5 wherein the predefined high voltage is VDD.
7. A method of claim 1, further comprising connecting a resistor in series with the fuse to define a resistor divider.
8. A method of claim 4, further comprising connecting a resistor in series with the poly-fuse to define a resistor divider.
9. A method of claim 8, wherein the resistor is chosen to define the initial unprogrammed state of the programmable circuit block as high or low.
10. A method of claim 9, wherein the resistor is tied to the power rail or the ground rail to allow the node between fuse and resistor to go either high or low once the fuse is blown.
11. A method of claim 7, further comprising connecting the node between the resistor and the fuse to an inverter.
12. A method of programming a fuses of a fuse-based programmable circuit block, comprising
    serially connecting two snapback devices between the power rail and the ground rail,
    serially connecting two fuses in parallel with the snapback devices, and
    connecting the node between the two snapback devices to the node between the two fuses.
13. A method of claim 12, wherein the method includes biasing the gate of one of the two snapback devices so as to force it into snapback mode, and biasing the gate of the other snapback device to keep it off.
14. A method of claim 13, wherein the snapback devices are LVTSCR or NMOS devices.
15. A method of claim 12, further comprising connecting the node between the two fuses to an inverter.
16. A fuse-based programmable circuit block, comprising
    a resistor divider defined by a resistor and a poly-fuse, and
    a snapback device connected in series with the poly-fuse, wherein the bias voltage of the control electrode of the snapback device is controllable.
17. A fuse-based programmable circuit block of claim 16 wherein the snapback device is an LVTSCR or NMOS device.
18. A fuse-based programmable circuit block of claim 16, wherein the resistor has a larger or a smaller value than the resistance of the poly-fuse.
19. A fuse-based programmable circuit block of claim 16, further comprising an inverter connected to the node between the resistor and the poly-fuse.

* * * * *